US011171670B2

(12) United States Patent
Lee et al.

(10) Patent No.: US 11,171,670 B2
(45) Date of Patent: Nov. 9, 2021

(54) PARITY GENERATION CIRCUITS FOR A PLURALITY OF ERROR CORRECTION LEVELS, MEMORY CONTROLLERS, AND MEMORY MODULES INCLUDING THE PARITY GENERATION CIRCUITS

(71) Applicant: SK hynix Inc., Icheon-si (KR)

(72) Inventors: Sung Eun Lee, Icheon-si (KR); Young Ook Song, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/910,865

(22) Filed: Jun. 24, 2020

(65) Prior Publication Data

US 2021/0119647 A1  Apr. 22, 2021

(30) Foreign Application Priority Data

Oct. 17, 2019 (KR) .................. 10-2019-0129436

(51) Int. Cl.
*H03M 13/00* (2006.01)
*H03M 13/29* (2006.01)
*G06F 11/10* (2006.01)

(52) U.S. Cl.
CPC ..... *H03M 13/2906* (2013.01); *G06F 11/1076* (2013.01); *H03M 13/616* (2013.01)

(58) Field of Classification Search
None
See application file for complete search history.

(56) References Cited

U.S. PATENT DOCUMENTS

| 2013/0332797 | A1* | 12/2013 | Chung | H03M 13/6502 714/763 |
| 2015/0178155 | A1* | 6/2015 | Kim | G11C 11/419 714/758 |
| 2018/0053545 | A1* | 2/2018 | Son | G11C 11/419 |
| 2019/0089383 | A1 | 3/2019 | Funaoka et al. | |
| 2019/0146870 | A1* | 5/2019 | Cha | G06F 11/1068 714/755 |
| 2021/0083687 | A1* | 3/2021 | Lee | H03M 13/1105 |

OTHER PUBLICATIONS

B. Harshitha, M. Karthik and V. Tambralli, "A Novel Approach for Design, Implementation and Construction of Low Density Parity Check (LDPC) Memory," 2015 Fifth International Conference on Advances in Computing and Communications (ICACC), 2015, pp. 473-476, doi: 10.1109/ICACC.2015.63. (Year: 2015).*

N. B. Anne, Utthaman Thirunavukkarasu and S. Latifi, "Three and four-dimensional parity-check codes for correction and detection of multiple errors," International Conference on Information Technology: Coding and Computing, 2004. Proceedings. ITCC 2004., 2004, pp. 837-842 vol. 2, (Year: 2004).*

* cited by examiner

Primary Examiner — Daniel F. McMahon
(74) Attorney, Agent, or Firm — William Park & Associates Ltd.

(57) ABSTRACT

A parity generation logic circuit includes a first parity generation part and a second parity generation part. The first parity generation part is configured to generate a first parity in a first error correction mode having a first error correction capability for original data. The second parity generation part is configured to generate a second parity using the first parity in a second error correction mode having a second error correction capability.

14 Claims, 5 Drawing Sheets

PARITY GENERATION CIRCUITS FOR A PLURALITY OF ERROR CORRECTION LEVELS, MEMORY CONTROLLERS, AND MEMORY MODULES INCLUDING THE PARITY GENERATION CIRCUITS

CROSS-REFERENCE TO RELATED APPLICATIONS

The present application claims priority under 35 U.S.C 119(a) to Korean Application No. 10-2019-0129436, filed on Oct. 17, 2019, which is incorporated herein by references in its entirety.

BACKGROUND

1. Technical Field

Various embodiments of the disclosed technology relate to memory systems and, more particularly, to parity generation circuits for a plurality of error correction levels, memory controllers, and memory modules including the parity generation circuits.

2. Related Art

In general, a path transmitting information is called a channel. When the information is transmitted using cable communication, a transmission line through which the information is transmitted may act as the channel. When the information is transmitted using wireless communication, the channel may be the space through which electromagnetic waves including the information are propagated. Processes for storing data in memory media (e.g., memory devices) and for reading out the data from the memory media may be performed through the channel.

When the data are transmitted through the channel, an error may be included in the data. Thus, much effort has been continuously focused on developing devices and methods for detecting errors in erroneous data and for removing the detected errors to restore the erroneous data to their original data. An error correction code (ECC) encoding operation and an ECC decoding operation have been widely used in memory systems including memory media. The ECC encoding operation may correspond to a process for generating transmission data by adding an error control code (or the error correction code) to original data (i.e., write data) before the original data are transmitted to perform a write operation. The ECC decoding operation may correspond to a process for performing a read operation to read out data stored in memory media and for separating the read data into the original data and the added code to restore the read data to the original data.

SUMMARY

According to an embodiment, a parity generation circuit includes a first parity generation part and a second parity generation part. The first parity generation part is configured to generate a first parity in a first error correction mode having a first error correction capability for original data. The second parity generation part is configured to generate a second parity using the first parity in a second error correction mode having a second error correction capability.

According to another embodiment, a memory controller for controlling a write operation of a memory device includes an error correction code (ECC) encoder including a parity generation logic circuit configured to generate a parity for original data. The parity generation logic circuit includes a first parity generation part and a second parity generation part. The first parity generation part is configured to generate a first parity in a first error correction mode having a first error correction capability. The second parity generation part is configured to generate a second parity using the first parity in a second error correction mode having a second error correction capability.

According to yet another embodiment is a memory module including a plurality of memory media and a memory module controller for controlling access to the memory media. The memory module controller includes an error correction code (ECC) encoder having a parity generation logic circuit configured to generate a parity for original data. The parity generation logic circuit includes a first parity generation part and a second parity generation part. The first parity generation part is configured to generate a first parity in a first error correction mode having a first error correction capability. The second parity generation part is configured to generate a second parity using the first parity in a second error correction mode having a second error correction capability.

According to still another embodiment, a method of generating a parity includes generating a first parity of original data in a first error correction mode having a first error correction capability. The method also includes generating a second parity using the first parity in a second error correction mode having a second error correction capability.

According to yet still another embodiment, a method of generating a parity includes calculating a first parity matrix for original data using a first encoding matrix and outputting the first parity matrix in a first error correction mode. The method also includes calculating a second parity matrix using the first encoding matrix and a trans matrix in a second error correction mode. The method further includes outputting the second parity matrix in the second error correction mode.

BRIEF DESCRIPTION OF THE DRAWINGS

Certain features of the disclosed technology are illustrated by various embodiments with reference to the included drawings, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on," "over," "above," "under," or "beneath" another element, it is intended to mean relative position relationship, but not used to limit certain cases that the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments are directed to parity generation circuits for a plurality of error correction levels, memory controllers, and memory modules including the parity generation circuits, and methods of generating a parity.

Figure 1:
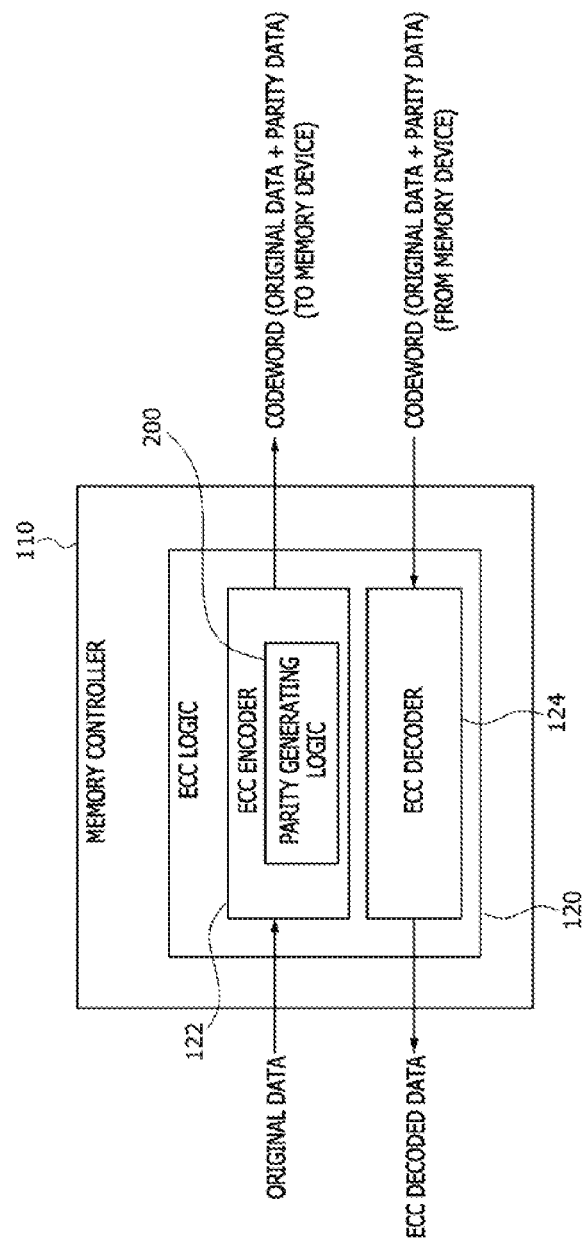
FIG. 1 is a block diagram illustrating a memory controller according to an embodiment of the present disclosure.

FIG. 1 is a block diagram illustrating an example of a memory controller 110 according to an embodiment of the present disclosure. Referring to FIG. 1, the memory controller 110 may include an error correction code (ECC) logic circuit 120. The ECC logic circuit 120 may include an ECC encoder 122 and an ECC decoder 124. The ECC encoder 122 may perform an ECC encoding operation while the memory controller 110 operates in a write mode for storing data in a memory device (not shown). The ECC decoder 124 may perform an ECC decoding operation when the memory controller 110 operates in a read mode for reading out the data stored in the memory device. The ECC encoder 122 may include a parity generation logic circuit 200.

In the write mode, the ECC encoder 122 may receive original data, which are written to the memory device, from an external device such as a host. The ECC encoder 122 may output a codeword after generating parity data by adding an error control code (or the error correction code) to the original data. The memory controller 110 may write the codeword outputted from the ECC encoder 122 into the memory device. The codeword may be configured to include the original data and the parity data. The parity generation logic circuit 200 may generate the parity data included in the codeword which is generated by the ECC encoder 122.

In the read mode, the memory controller 110 may operate such that read data (i.e., the codeword including the original data and the parity data) outputted from the memory device are inputted to the ECC decoder 124. The ECC decoder 124 may perform the ECC decoding operation of the codeword which is inputted to the ECC decoder 124. The ECC decoder 124 may correct an error of the codeword to output ECC decoded data when the error is detected during the ECC decoding operation. The ECC decoding operation may be performed by calculating a syndrome of the codeword, by calculating an error location polynomial using the syndrome, by finding a solution of the error location polynomial to calculate an error location and an error magnitude, and by correcting the detected error. The memory controller 110 may transmit the ECC decoded data outputted from the ECC decoder 124 to an external device (e.g., a host).

In the present embodiment, the ECC logic circuit 120 may have a plurality of error correction capabilities, for example, a first error correction capability and a second error correction capability. In an embodiment, the error correction capability may be different according to an algorithm used in error correction. For example, when a Reed-Solomon (RS) code including a symbol having a plurality of data bits and a plurality of parity bits is used as an error correction code, the error correction capability may be defined as the number of symbols whose errors are correctable. When a Bose-Chaudhuri-Hocquenghem (BCH) code including one binary data bit and one binary parity bit is used as an error correction code, the error correction capability may be defined as the number of bits whose errors are correctable. The first error correction capability may be different from the second error correction capability. The first error correction capability may be greater than the second error correction capability. The first error correction capability may be applied in a first error correction mode, and the second error correction capability may be applied in a second error correction mode. When an error occurrence probability is relatively high during the write operation and the read operation, the ECC logic circuit 120 may operate in the first error correction mode. In such a case, a relatively large number of first parities may be generated. In contrast, when an error occurrence probability is relatively low during the write operation and the read operation, the ECC logic circuit 120 may operate in the second error correction mode. In such a case, a relatively small number of second parities may be generated.

Figure 2:
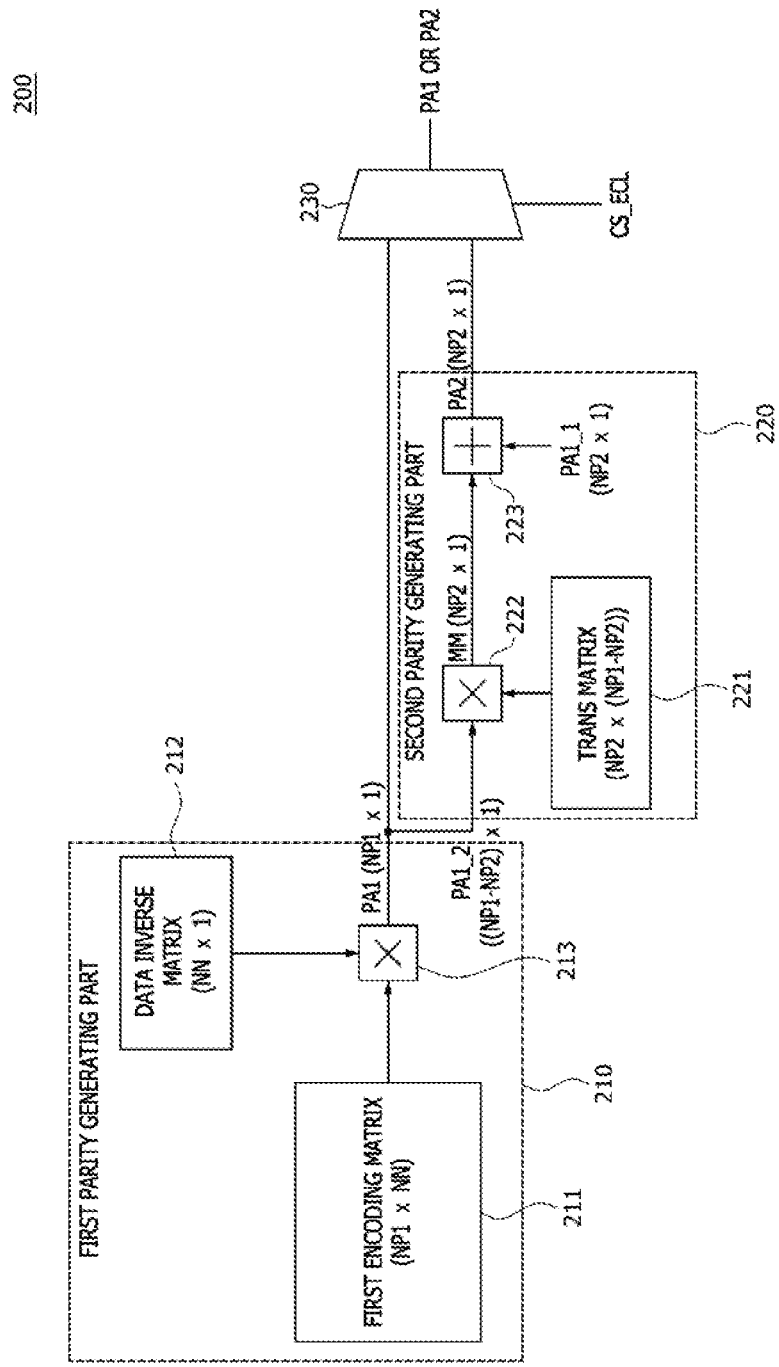
FIG. 2 illustrates an example of a parity generation logic circuit included in the memory controller of FIG. 1.

FIG. 2 illustrates an example of the parity generation logic circuit 200 included in the memory controller 110 of FIG. 1. Referring to FIG. 2, the parity generation logic circuit 200 may include a first parity generation part 210, a second parity generation part 220, and a selection output part 230. In an embodiment, the selection output part 230 may be realized using a multiplexer. The first parity generation part 210 may generate a first parity matrix PA1 for the original data. Each element in the first parity matrix PA1 may include a first parity symbol used in the first error correction mode to which the first error correction capability is applied. The second parity generation part 220 may generate a second parity matrix PA2 using the first parity matrix PA1. Each element in the second parity matrix PA2 may include a second parity symbol used in the second error correction mode to which the second error correction capability is applied. Because the second parity matrix PA2 is generated using the first parity matrix PA1, the first parity generation part 210 may operate in the first and second error correction modes. In contrast, the second parity generation part 220 might operate only in the second error correction mode.

The ECC encoding operation utilizing an RS algorithm using the RS code will be described hereinafter. When the BCH code is used for the ECC encoding operation, the ECC encoding operation using the BCH code may be performed in the same way as the ECC encoding operation using the RS algorithm except that the data are processed in units of bits instead of the symbols. In addition, the following ECC encoding operation will be described in conjunction with a case for which the original data include "NN"-number of data symbols (where, "NN" is a natural number), the first parity matrix PA1 includes "NP1"-number of first parity symbols (where, "NP1" is a natural number), and the second parity matrix PA2 includes "NP2"-number of second parity symbols (where, "NP2" is a natural number). As described with reference to FIG. 1, because the error correction capability in the first error correction mode is greater than the error correction capability in the second error correction mode, the number "NP1" of the first parity symbols in the first parity matrix PA1 may be greater than the number "NP2" of the second parity symbols in the second parity matrix PA2.

The first parity generation part 210 may be configured to include a first encoding matrix logic circuit 211, a data inverse matrix logic circuit 212, and a first matrix multiplier 213. The first encoding matrix logic circuit 211 may output a first encoding matrix Encoding_Matrix1 calculated by the following equation 1.

$$\text{Encoding\_Matrix1}=[\text{address}(\text{check1})]^{-1}\times[\text{address}(\text{data1})] \quad \text{(Equation 1)}$$

In equation 1, [address(check1)]$^{-1}$ denotes the inverse matrix of a matrix [address(check1)]. The matrix [address(check1)] may be expressed by the following equation 2.

$$[address(check1)] = \begin{bmatrix} AP_{0,0} & AP_{1,0} & \cdots & AP_{NP1-1,0} \\ AP_{0,1} & AP_{1,1} & \cdots & AP_{NP1-1,1} \\ \vdots & \vdots & \ddots & \vdots \\ AP_{0,NP1-1} & AP_{1,NP1-1} & \cdots & AP_{NP1-1,NP1-1} \end{bmatrix} \quad \text{(Equation 2)}$$

In equation 2, the matrix [address(check1)] may have "NP1"-number of rows and "NP1"-number of columns. That is, the number of rows and the number of columns of the matrix [address(check1)] may be equal to the number "NP1" of the first parity symbols in the first error correction mode. Each of the elements constituting the matrix [address(check1)] may be multiplied by a parity symbol to provide a constant used when a syndrome is calculated. For example, an element "$AP_{0,0}$" located at a cross point of a first row and a first column may be multiplied by a first parity symbol to provide a constant used when a first syndrome is calculated. Similarly, an element "$AP_{NP1-1,NP1-1}$" located at a cross point of an $NP1^{th}$ row and an $NP1^{th}$ column may be multiplied by an $NP1^{th}$ parity symbol to provide a constant used when an $NP1^{th}$ syndrome is calculated.

In equation 1, the matrix [address(data1)] may be expressed by the following equation 3.

$$[address(data1)] = \begin{bmatrix} AD_{0,0} & AD_{1,0} & \cdots & AD_{NN-1,0} \\ AD_{0,1} & AD_{1,1} & \cdots & AD_{NN-1,1} \\ \vdots & \vdots & \ddots & \vdots \\ AD_{0,NP1-1} & AD_{1,NP1-1} & \cdots & AD_{NN-1,NP1-1} \end{bmatrix} \quad \text{(Equation 3)}$$

In equation 3, the matrix [address(data1)] may have "NP1"-number of rows and "NN"-number of columns. That is, the number of rows in the matrix [address(data1)] may be equal to the number "NP1" of the first parity symbols in the first error correction mode, and the number of columns in the matrix [address(data 1)] may be equal to the number "NN" of the data symbols in the first error correction mode. Each of the elements constituting the matrix [address(data1)] may be multiplied by a data symbol to provide a constant used when a syndrome is calculated. For example, an element "$AD_{0,0}$" located at a cross point of a first row and a first column may be multiplied by a first data symbol to provide a constant used when a first syndrome is calculated. Similarly, an element "$AD_{NN-1,NP1-1}$" located at a cross point of an $NP1^{th}$ row and an $NN^{th}$ column may be multiplied by an $NN^{th}$ data symbol to provide a constant used when an $NP1^{th}$ syndrome is calculated.

The data inverse matrix logic circuit 212 may output a data inverse matrix Data_Inverse_Matrix calculated by the flowing equation 4.

$$Data\_Inverse\_Matrix = \begin{bmatrix} D_0 \\ D_1 \\ D_2 \\ \vdots \\ D_{NN-2} \\ D_{NN-1} \end{bmatrix} \quad \text{(Equation 4)}$$

In equation 4, the data inverse matrix Data_Inverse_Matrix may have "NN"-number of rows and one column. Elements $D_0, D_1, D_2, \ldots, D_{NN-2}$, and $D_{NN-1}$ constituting the data inverse matrix Data_Inverse_Matrix may include "NN"-number of data symbols.

The first matrix multiplier 213 may perform a matrix multiplication of the first encoding matrix Encoding_Matrix1 outputted from the first encoding matrix logic circuit 211 and the data inverse matrix Data_Inverse_Matrix outputted from the data inverse matrix logic circuit 212 to generate and output the first parity matrix PA1. Because the first encoding matrix Encoding_Matrix1 has an 'NP1×NN' matrix form and the data inverse matrix Data_Inverse_Matrix has an 'NN×1' matrix form, the first parity matrix PA1 may have an 'NP1×1' matrix form as expressed by the following equation 5.

$$PA1 = \begin{bmatrix} P1_0 \\ P1_1 \\ P1_2 \\ \vdots \\ P1_{NP1-2} \\ P1_{NP1-1} \end{bmatrix} \quad \text{(Equation 5)}$$

In equation 5, the first parity matrix PA1 may have "NP1"-number of rows and one column. For some described embodiments, a matrix having an 'A×B' matrix form means the matrix has A rows and B columns. Elements $P1_0, P1_1, P1_2, \ldots, P1_{NP1-2}$, and $P1_{NP1-1}$ constituting the first parity matrix PA1 may include "NP1"-number of first parity symbols. That is, the first parity symbols used in the first error correction mode may have values corresponding to elements located in one column of the first parity matrix PA1, respectively.

The first parity matrix PA1 outputted from the first matrix multiplier 213 may be inputted to a first input terminal of the selection output part 230 realized using a multiplexer. In addition, the first parity matrix PA1 outputted from the first matrix multiplier 213 may be divided into a low-order first parity matrix PA1_1 and a high-order first parity matrix PA1_2, and the low-order first parity matrix PA1_1 and the high-order first parity matrix PA1_2 may be inputted to respective ones of a matrix adder 223 and a second matrix multiplier 222 included in the second parity generation part 220. The low-order first parity matrix PA1_1 may include elements arrayed from a first row to a $NP2^{th}$ row among the elements of the first parity matrix PA1, as expressed by the following equation 6.

$$PA1\_1 = \begin{bmatrix} P1_0 \\ P1_1 \\ \vdots \\ P1_{NP2-1} \end{bmatrix} \quad \text{(Equation 6)}$$

In addition, the high-order first parity matrix PA1_2 may include elements arrayed from a $(NP2+1)^{th}$ row to the last row among the elements of the first parity matrix PA1, as expressed by the following equation 7.

$$PA1\_2 = \begin{bmatrix} P1_{NP2} \\ P1_{NP2+1} \\ \vdots \\ P1_{NP1-1} \end{bmatrix} \quad \text{(Equation 7)}$$

The second parity generation part 220 may be configured to include a trans matrix logic circuit 221, the second matrix multiplier 222, and the matrix adder 223. The trans matrix logic circuit 221 may output a trans matrix Trans_Matrix which is used to calculate the second parity matrix PA2 using the first parity matrix PA1, In a process for generating the trans matrix Trans_Matrix, a second encoding matrix Encoding_Matrix2 used in the second error correction mode may be expressed by the following equation 8.

$$\text{Encoding\_Matrix2} = [\text{address(check2)}]^{-1} \times [\text{address(data2)}] \quad \text{(Equation 8)}$$

In equation 8, $[\text{address(check2)}]^{-1}$ denotes an inverse matrix of a matrix $[\text{address(check2)}]$. The matrix $[\text{address(check2)}]$ may be expressed by the following equation 9.

$$[\text{address(check2)}] = \begin{bmatrix} AP_{0,0} & AP_{1,0} & \cdots & AP_{NP2-1,0} \\ AP_{0,1} & AP_{1,1} & \cdots & AP_{NP2-1,1} \\ \vdots & \vdots & \ddots & \vdots \\ AP_{0,NP2-1} & AP_{1,NP2-1} & \cdots & AP_{NP2-1,NP2-1} \end{bmatrix} \quad \text{(Equation 9)}$$

In equation 9, the matrix [address(check2)] may have "NP2"-number of rows and "NP2"-number of columns. That is, the number of rows and the number of columns of the matrix [address(check2)] may be equal to the number "NP2" of the second parity symbols in the second error correction mode. Like the matrix [address(check1)] expressed by equation 2, each of the elements constituting the matrix [address(check2)] may be multiplied by a parity symbol to provide a constant used when a syndrome is calculated. For example, an element "$AP_{0,0}$" located at a cross point of a first row and a first column may be multiplied by a first parity symbol to provide a constant used when a first syndrome is calculated. Similarly, an element "$AP_{NP2-1,NP2-1}$" located at a cross point of an $NP2^{th}$ row and an $NP2^{th}$ column may be multiplied by an $NP2^{th}$ parity symbol to provide a constant used when an $NP2^{th}$ syndrome is calculated.

In equation 8, the matrix [address(data2)] may be expressed by the following equation 10.

$$[\text{address(data2)}] = \begin{bmatrix} AD_{0,0} & AD_{1,0} & \cdots & AD_{NN-1,0} \\ AD_{0,1} & AD_{1,1} & \cdots & AD_{NN-1,1} \\ \vdots & \vdots & \ddots & \vdots \\ AD_{0,NP2-1} & AD_{1,NP2-1} & \cdots & AD_{NN-1,NP2-1} \end{bmatrix} \quad \text{(Equation 10)}$$

In equation 10, the matrix [address(data2)] may have "NP2"-number of rows and "NN"-number of columns. That is, the number of rows in the matrix [address(data2)] may be equal to the number "NP2" of the second parity symbols in the second error correction mode, and the number of columns in the matrix [address(data2)] may be equal to the number "NN" of the data symbols in the second error correction mode. Like the matrix [address(data1)] expressed by equation 3, each of the elements constituting the matrix [address(data2)] may be multiplied by a data symbol to provide a constant used when a syndrome is calculated. For example, an element "$AD_{0,0}$" located at a cross point of a first row and a first column may be multiplied by a first data symbol to provide a constant used when a first syndrome is calculated. Similarly, an element "$AD_{NN-1,NP2-1}$" located at a cross point of an $NP2^{th}$ row and an $NN^{th}$ column may be multiplied by an $NN^{th}$ data symbol to provide a constant used when an $NP2^{th}$ syndrome is calculated.

Because the matrix [address(check2)] has an 'NP2×NP2' matrix form and the matrix [address(data2)] has an 'NP2×NN' matrix form, the second encoding matrix Encoding_Matrix2 may have an 'NP2×NN' matrix form. If the matrix [address(data2)] in equation 8 is expressed as "[address(check11)]×[address(check1)]$^{-1}$×[address(data1)]," the second encoding matrix Encoding_Matrix2 of equation 8 may be rewritten as the following equation 11.

$$\text{Encoding\_Matrx2} = [\text{address(check2)}]^{-1} \times [\text{address(check11)}] \times [\text{address(check1)}]^{-1} \times [\text{address(data1)}] \quad \text{(Equation 11)}$$

In equation 11, the matrix $[\text{address(check2)}]^{-1}$ may have an 'NP2×NP2' matrix form, the matrix [address(check11)] may have an 'NP2×NP1' matrix form, the matrix $[\text{address(check1)}]^{-1}$ may have an 'NP1×NP1' matrix form, and the matrix [address(data1)] may have an 'NP1×NN' matrix form. In equation 11, the matrix [address(check11)] may correspond to a matrix which includes elements arrayed in some of rows in the matrix [address(check1)]. This is for adjusting the number of rows in the matrix [address(check11)] such that the number of rows in the matrix [address(check11)] is equal to the number of columns in the matrix $[\text{address(check2)}]^{-1}$ for a matrix calculation. Thus, the matrix [address(check11)] may include elements arrayed from the first row to the $NP2^{th}$ row in the matrix [address(check1)] of equation 2 and may be expressed by the following equation 12.

$$[\text{address(check11)}] = \begin{bmatrix} AP_{0,0} & AP_{1,0} & \cdots & AP_{NP1-1,0} \\ AP_{0,1} & AP_{1,1} & \cdots & AP_{NP1-1,1} \\ \vdots & \vdots & \ddots & \vdots \\ AP_{0,NP2-1} & AP_{1,NP2-1} & \cdots & AP_{NP1-1,NP2-1} \end{bmatrix} \quad \text{(Equation 12)}$$

The matrix [address(check11)] expressed by equation 12 may be rewritten as the following equation 13.

$$[\text{address(check11)}] = \begin{bmatrix} AP_{0,0} & AP_{1,0} & \cdots & AP_{NP2-1,0} \\ AP_{0,1} & AP_{1,1} & \cdots & AP_{NP2-1,1} \\ \vdots & \vdots & \ddots & \vdots \\ AP_{0,NP2-1} & AP_{1,NP2-1} & \cdots & AP_{NP2-1,NP2-1} \end{bmatrix} |Xmat| = \quad \text{(Equation 13)}$$

$$[\text{address(check2)}|Xmat]$$

As expressed by equation 13, the matrix [address (check11)] may be divided into a matrix [address(check2)] including elements arrayed from a first row to NP2$^{th}$ row in the matrix [address(check11)] to have a 'NP2×NP2$^1$' matrix form and a matrix [Xmat] including elements arrayed from a (NP2+1)$^{th}$ row to the last row (i.e., a NP1$^{th}$ row) in the matrix [address(check11)] to have a "NP2×(NP1-NP2)" matrix form. All of elements in the matrix [Xmat] may be arbitrary constants.

Meanwhile, in equation 11, the product of the matrix [address(check1)]$^{-1}$ having a 'NP1×NP1' matrix form and the matrix [address(data1)] having a 'NP1×NN' matrix form may be the same as the first encoding matrix Encoding_Matrix1 expressed by equation 1. Thus, the second encoding matrix Encoding_Matrix2 of equation 11 may be rewritten as the following equation 14.

$$\text{Encoding\_Matrix2}=[\text{address(check2)}]^{-1} \times [\text{address(check11)}] \times (\text{Encoding\_Matrix1}) \quad \text{(Equation 14)}$$

If equation 13 is substituted into equation 14, the second encoding matrix Encoding_Matrix2 may be expressed by the following equation 15.

$$\text{Encoding\_Matrix2}=[\text{address(check2)}]^{-1} \times [\text{address(check2)[Xmat]}] \times (\text{Encoding\_Matrix}) \quad \text{(Equation 15)}$$

In equation 15, because the product of the matrix [address (check2)]$^{-1}$ having a 'NP2×NP2' matrix form and the matrix [address(check2)] having a 'NP2×NP2' matrix form is an identical matrix having a 'NP2×NP2' matrix form, the second encoding matrix Encoding_Matrix2 may be expressed by the following equation 16.

$$\text{Encoding\_Matrix2}=[\text{Identical Matrix}|\text{Ymat}] \times (\text{Encoding\_Matrix1}) \quad \text{(Equation 16)}$$

According to equation 16, the second encoding matrix Encoding_Matrix2 may be calculated by multiplying the matrix [Identical_Matrix|Ymat] by the first encoding matrix Encoding_Matrix1. This means that the second parity matrix PA2 including the second parity symbols used in the second error correction mode can be calculated by multiplying the matrix [Identical_Matrix|Ymat] by the first parity matrix PA1. Thus, the second parity matrix PA2 may be expressed by the following equation 17.

$$PA2 = \begin{bmatrix} 1 & 0 & \cdots & 0 & Y_{0,0} & \cdots & Y_{0,(NP1-NP2)} \\ 0 & 1 & \cdots & 0 & Y_{1,0} & \cdots & Y_{1,(NP1-NP2)} \\ \vdots & \vdots & \ddots & \vdots & \vdots & \ddots & \vdots \\ 0 & 0 & \cdots & 1 & Y_{NP2,0} & \cdots & Y_{NP2,(NP1-NP2)} \end{bmatrix} \times \quad \text{(Equation 17)}$$

$$\begin{bmatrix} P1_0 \\ P1_1 \\ P1_2 \\ \vdots \\ P1_{NP1-2} \\ P1_{NP1-1} \end{bmatrix} = \begin{bmatrix} P1_0 \\ P1_1 \\ P1_2 \\ \vdots \\ P1_{NP2-2} \\ P1_{NP2-1} \end{bmatrix} +$$

$$\begin{bmatrix} Y_{0,0} & \cdots & Y_{0,(NP1-NP2)} \\ Y_{1,0} & \cdots & Y_{1,(NP1-NP2)} \\ \vdots & \ddots & \vdots \\ Y_{NP2,0} & \cdots & Y_{NP2,(NP1-NP2)} \end{bmatrix} \times \begin{bmatrix} P1_{NP2} \\ P1_{NP2+1} \\ P1_{NP2+2} \\ \vdots \\ P1_{NP1-2} \\ P1_{NP1-1} \end{bmatrix} = PA1\_$$

$$1 + \begin{bmatrix} Y_{0,0} & \cdots & Y_{0,(NP1-NP2)} \\ Y_{1,0} & \cdots & Y_{1,(NP1-NP2)} \\ \vdots & \ddots & \vdots \\ Y_{NP2,0} & \cdots & Y_{NP2,(NP1-NP2)} \end{bmatrix} \times PA1\_2$$

In equation 17, because the low-order first parity matrix PA1_1 and the high-order first parity matrix PA1_2 are obtained from the first parity matrix PA1 outputted from the first parity generation part 210, only the matrix [Ymat] may be required to calculate the second parity matrix PA2. That is, the trans matrix logic circuit 221 of the second parity generation part 220 may calculate and output the matrix [Ymat] having a 'NP2×(NP1−NP2)' matrix form, which is shown in equation 16.

The second matrix multiplier 222 of the second parity generation part 220 may perform a multiplying operation of the matrix [Ymat] outputted from the trans matrix logic circuit 221 and the high-order first parity matrix PA1_2 to output a mid-matrix [MM], The mid-matrix [MM] outputted from the second matrix multiplier 222 may have a 'NP2×1' matrix form. The mid-matrix [MM] outputted from the second matrix multiplier 222 may be inputted to the matrix adder 223. The matrix adder 223 may perform an adding operation of the low-order first parity matrix PA1_1 outputted from the first parity generation part 210 and the mid-matrix [MM] outputted from the second matrix multiplier 222 and may output the second parity matrix PA2 as a result of the adding operation. The second parity matrix PA2 may have a 'NP2×1' matrix form. The second parity matrix PA2 may be inputted to a second input terminal of the selection output part 230 (i.e., a multiplexer).

The multiplexer 230 may select and output the data inputted to the first input terminal of the multiplexer 230 or the data inputted to the second input terminal of the multiplexer 230 in response to an error correction mode control signal CS_ECL. The error correction mode control signal CS_ECL may be inputted to a control signal input terminal of the multiplexer 230. The first input terminal of the multiplexer 230 may receive the first parity matrix PA1 outputted from the first parity generation part 210. The second input terminal of the multiplexer 230 may receive the second parity matrix PA2 outputted from the second parity generation part 220. In an embodiment, the error correction mode control signal CS_ECL having a logic "high(1)" level may be inputted to the multiplexer 230 in the first error correction mode. In such a case, the multiplexer 230 may output the first parity matrix PA1 inputted to the first input terminal of the multiplexer 230. In contrast, the error correction mode control signal CS_ECL having a logic "low (0)" level may be inputted to the multiplexer 230 in the second error correction mode. In such a case, the multiplexer 230 may output the second parity matrix PA2 inputted to the second input terminal of the multiplexer 230.

Figure 3:
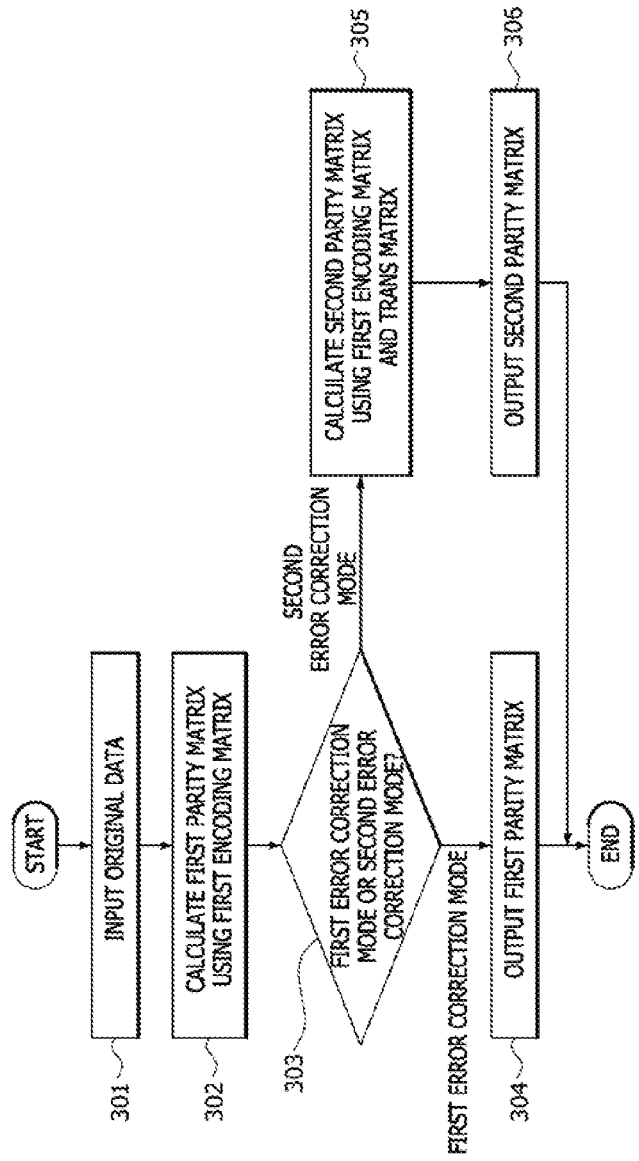
FIG. 3 is a flowchart illustrating a method of generating a parity according to an embodiment of the present disclosure.

FIG. 3 is a flowchart illustrating a method of generating a parity according to an embodiment of the present disclosure. Referring to FIG. 3, the original data may be inputted to the memory controller 110 at a step 301. In such a case, the first parity matrix PA1 may be calculated using the first encoding matrix Encoding_Matrix1 at a step 302. Whether the error correction mode is the first error correction mode or the second error correction mode may be determined at a step 303. When the error correction mode is determined to be the first error correction mode at the step 303, the first parity matrix PA1 calculated at the step 302 may be outputted from the parity generation logic circuit 200 at a step 304. When the error correction mode is determined to be the second error correction mode at the step 303, the second parity matrix PA2 may be calculated using the first encoding matrix Encoding_Matrix1 and the trans matrix Trans_Matrix at a step 305. A process of the step 305 may be the same as described with reference to FIG. 2. The second parity matrix PA2 calculated at the step 305 may be outputted from the parity generation logic circuit 200 at a step 306.

Figure 4:
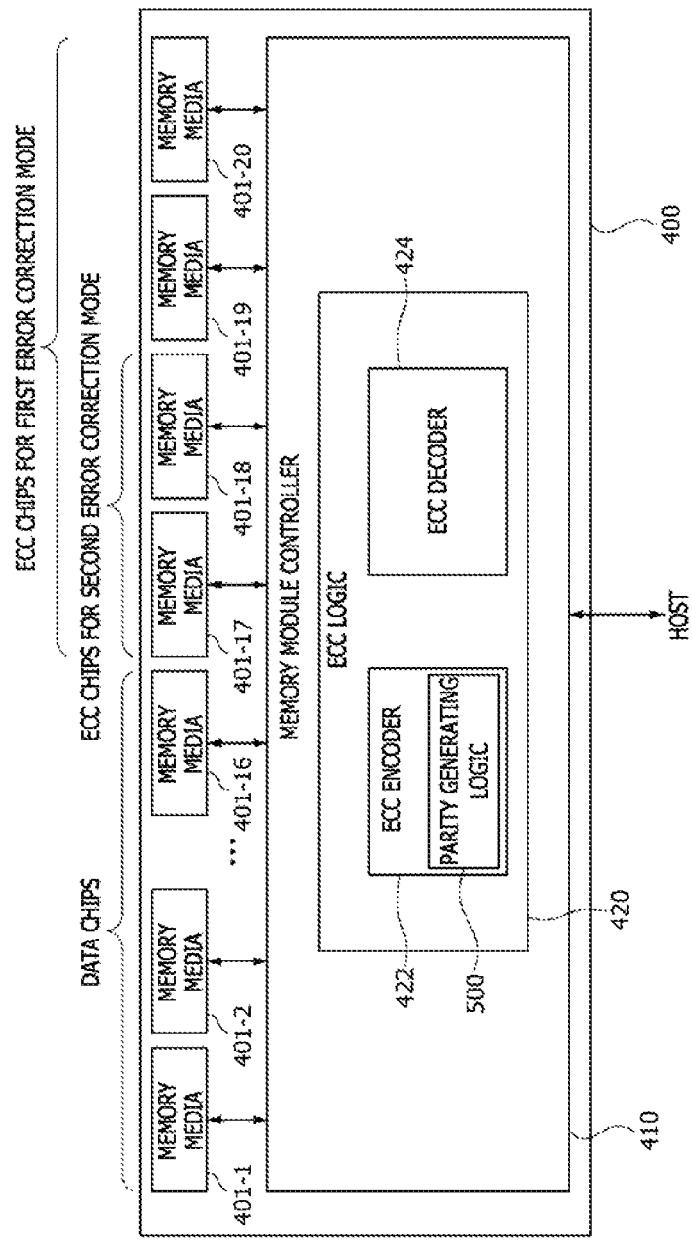
FIG. 4 is a block diagram illustrating a memory module including a parity generation logic circuit according to an embodiment of the present disclosure.

FIG. 4 is a block diagram illustrating a memory module 400 according to an embodiment of the present disclosure. Referring to FIG. 4, the memory module 400 may include a plurality of memory media (e.g., first to twentieth memory media 401-1, ..., and 401-20) and a memory module controller 410. In an embodiment, each of the first to twentieth memory media 401-1, ..., and 401-20 may be a memory chip. Sixteen memory media (e.g., the first to sixteenth memory media 401-1, ... and 401-16) among the first to twentieth memory media 401-1, ..., and 401-20 may act as data chips in which data are stored. Four memory media (e.g., the seventeenth to twentieth memory media 401-17, ... and 401-20) among the first to twentieth memory media 401-1, ..., and 401-20 may act as ECC chips storing parities which are generated in the first error correction mode. Two memory media (e.g., the seventeenth and eighteenth memory media 401-17 and 401-18 among the seventeenth to twentieth memory media 401-17, ... and 401-20 storing the parities generated in the first error correction mode may act as ECC chips storing the parities which are generated in the second error correction mode. Thus, the seventeenth and eighteenth memory media 401-17 and 401-18 may store the parities in both of the first and second error correction modes, and the nineteenth and twentieth memory media 401-19 and 401-20 might store the parities only in the first error correction mode.

Because the number of ECC chips storing the parities in the first error correction mode is different from the number of ECC chips storing the parities in the second error correction mode, the error correction capability in the first error correction mode may also be different from the error correction capability in the second error correction mode. In the following description, it may be assumed that data access to each of the memory media 401-1 and 401-20 is executed in units of 32 bits, metadata access to the memory media 401-1, ..., and 401-16 storing the data is executed in units of 8 bits, and each symbol includes 7 bits.

Because the data access to each of the memory media 401-1 and 401-20 is executed in units of 32 bits, five symbols may be generated in each memory media. Each of four symbols among the five symbols may include 7-bit data, and the remaining one symbol among the five symbols may include 4-bit data and 3-bit arbitrary data. The 3-bit arbitrary data are binary data for fitting the number of bits included in each symbol, and the 3-bit arbitrary data may include bits having a logic "low(0)" level. The first to sixteenth memory media 401-1, ..., and 401-16 storing data may be coupled to the memory module controller 410 in parallel to receive or output the data in units of 82 symbols. The 82 symbols may include 80 data symbols and 2 metadata symbols. Because the metadata includes 8 bits, one of the 2 metadata symbols may include 1-bit metadata and 6-bit arbitrary data.

In the first error correction mode, the parity symbols may be stored in the seventeenth to twentieth memory media 401-17, ..., and 401-20. Each of the seventeenth to twentieth memory media 401-17, ..., and 401-20 may receive or output the data in units of 32 bits, and 8-bit metadata may be stored into the seventeenth to twentieth memory media 401-17, ..., and 401-20. Thus, in the first error correction mode, 120-bit parity data (i.e., 17 parity symbols) may be stored in the seventeenth to twentieth memory media 401-17, ..., and 401-20. In the second correction mode, the parity symbols may be stored in two memory media, for example, the seventeenth and eighteenth memory media 401-17 and 401-18. Each of the seventeenth and eighteenth memory media 401-17 and 401-18 may receive or output the data in units of 32 bits, and 8-bit metadata may be stored in the seventeenth and eighteenth memory media 401-17 and 401-18. Thus, in the second error correction mode, 56-bit parity data (i.e., 8 parity symbols) may be stored in the seventeenth and eighteenth memory media 401-17 and 401-18. In the first error correction mode which is capable of storing 17 parity symbols, it may be possible to correct the errors of 8 data symbols. In contrast, in the second error correction mode which is capable of storing 8 parity symbols, it may be possible to correct the errors of 4 data symbols.

The memory module controller 410 may communicate with an external device (e.g., a host) to control the access to the memory media 401-1, ..., and 401-20. The memory module controller 410 may include an ECC logic circuit 420. The ECC logic circuit 420 may include an ECC encoder 422 and an ECC decoder 424. The ECC encoder 422 may perform an ECC encoding operation while the memory module controller 410 operates in a write mode. The ECC decoder 424 may perform an ECC decoding operation while the memory module controller 410 operates in a read mode. The ECC encoder 422 and the ECC decoder 424 may have the same configurations as the ECC encoder 122 and the ECC decoder 124 described with reference to FIG. 1, respectively. Thus, detailed descriptions of the ECC encoder 422 and the ECC decoder 424 will be omitted hereinafter to avoid duplicate explanation.

Figure 5:
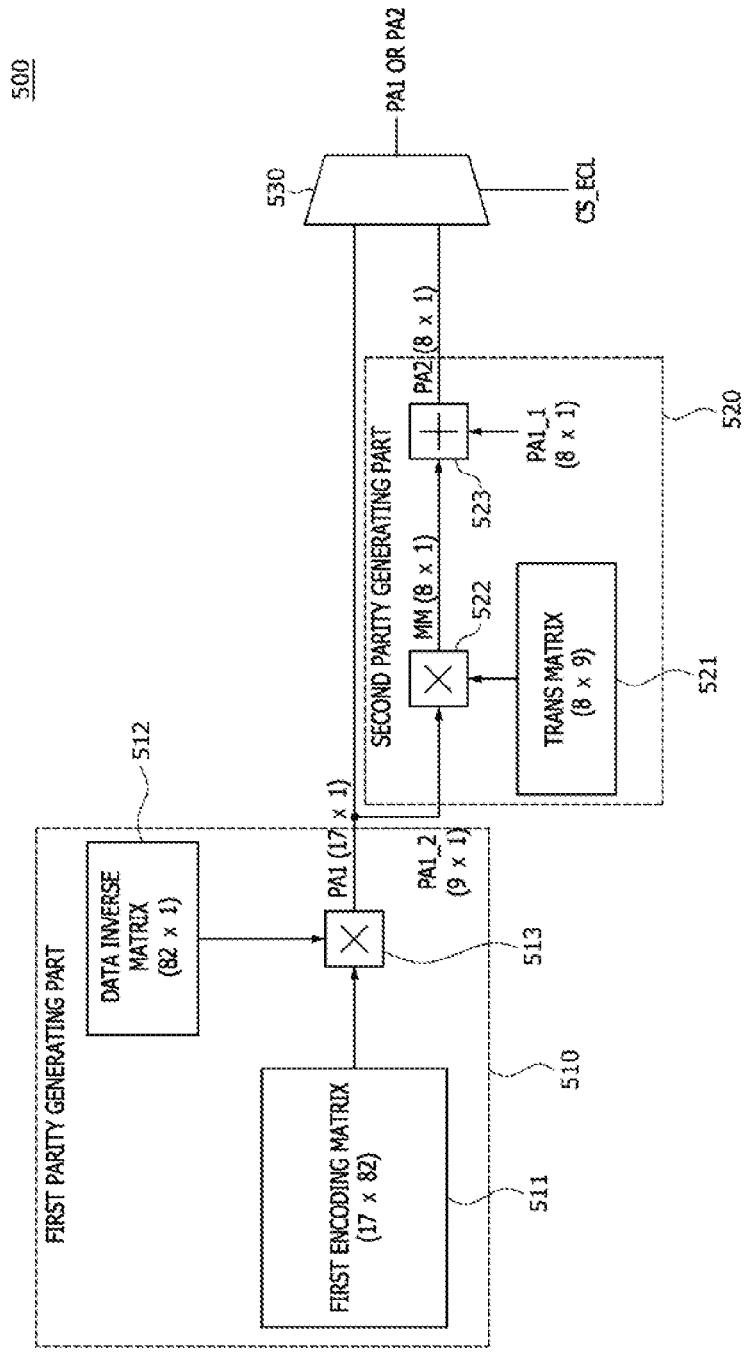
FIG. 5 illustrates an example of a parity generation logic circuit included in the memory module of FIG. 4.

FIG. 5 illustrates a parity generation logic circuit 500 included in the ECC encoder 422 of FIG. 4. Referring to FIG. 5, the parity generation logic circuit 500 may include a first parity generation part 510, a second parity generation part 520, and a multiplexer 530. The first parity generation part 510 may generate a first parity matrix PA1 having a '17×1' matrix form. Each of 17 elements in the first parity matrix PA1 may constitute a first parity symbol used in the first error correction mode. The second parity generation part 520 may generate a second parity matrix PA2 having a '8×1' matrix form using the first parity matrix PA1 outputted from the first parity generation part 510. Each of 8 elements in the second parity matrix PA2 may constitute a second parity symbol used in the second error correction mode. Because the second parity matrix PA2 is generated using the first parity matrix PA1, the first parity generation part 510 may operate regardless of the error correction mode. In contrast, the second parity generation part 520 might operate only in the second error correction mode.

The first parity generation part 510 may be configured to include a first encoding matrix logic circuit 511, a data inverse matrix logic circuit 512, and a first matrix multiplier 513, The first encoding matrix logic circuit 511 may output a first encoding matrix Encoding_Matrix1 having a '17×82' matrix form as described with reference to equations 1 to 3 and may be expressed by the following equation 18.

$$\text{Encoding\_Matrix1} = \begin{bmatrix} AP_{0,0} & AP_{1,0} & \cdots & AP_{16,0} \\ AP_{0,1} & AP_{1,1} & \cdots & AP_{16,1} \\ \vdots & \vdots & \ddots & \vdots \\ AP_{0,16} & AP_{1,16} & \cdots & AP_{16,16} \end{bmatrix}^{-1} \times \quad \text{(Equation 18)}$$

$$\begin{bmatrix} AD_{0,0} & AD_{1,0} & \cdots & AD_{81,0} \\ AD_{0,1} & AD_{1,1} & \cdots & AD_{81,1} \\ \vdots & \vdots & \ddots & \vdots \\ AD_{0,16} & AD_{1,16} & \cdots & AD_{81,16} \end{bmatrix}$$

The data inverse matrix logic circuit 512 may output a data inverse matrix Data_Inverse_Matrix having a '82×1' matrix form as described with reference to equation 4 and may be expressed by the flowing equation 19.

$$\text{Data\_Inverse\_Matrix} = \begin{bmatrix} D_0 \\ D_1 \\ D_2 \\ \vdots \\ D_{80} \\ D_{81} \end{bmatrix} \quad \text{(Equation 19)}$$

The first matrix multiplier 513 may perform a matrix multiplication of the first encoding matrix Encoding_Matrix1 outputted from the first encoding matrix logic circuit 511 to have a '17×82' matrix form and the data inverse matrix Data_Inverse_Matrix outputted from the data inverse matrix logic circuit 512 to have a '82×1' matrix form, thereby generating and outputting the first parity matrix PA1 having a '17×1' matrix form. The first parity matrix PA1 may be expressed by the following equation 20.

$$PA1 = \begin{bmatrix} P1_0 \\ P1_1 \\ P1_2 \\ \vdots \\ P1_{15} \\ P1_{16} \end{bmatrix} \quad \text{(Equation 20)}$$

The first parity matrix PA1 outputted from the first matrix multiplier 513 to have a '17×1' matrix form may be inputted to a first input terminal of the multiplexer 530. In addition, as described with reference to equations 6 and 7, the first parity matrix PA1 outputted from the first matrix multiplier 513 may be divided into a low-order first parity matrix PA1_1 and a high-order first parity matrix PA1_2, and the low-order first parity matrix PA1_1 and the high-order first parity matrix PA1_2 may be inputted to respective ones of a matrix adder 523 and a second matrix multiplier 522 included in the second parity generation part 520. The low-order first parity matrix PA1_1 may have a '8×1' matrix form, and the high-order first parity matrix PA1_2 may have a '9×1' matrix form. The low-order first parity matrix PA1_1 and the high-order first parity matrix PA1_2 may be expressed by the following equations 21 and 22, respectively.

$$PA1\_1 = \begin{bmatrix} P1_0 \\ P1_1 \\ \vdots \\ P1_7 \end{bmatrix} \quad \text{(Equation 21)}$$

$$PA1\_2 = \begin{bmatrix} P1_8 \\ P1_9 \\ \vdots \\ P1_{16} \end{bmatrix} \quad \text{(Equation 22)}$$

The second parity generation part 520 may be configured to include a trans matrix logic circuit 521, the second matrix multiplier 522, and the matrix adder 523. As described with reference to equations 8 to 17, the trans matrix logic circuit 521 may output a trans matrix Trans_Matrix [Ymat] which is used to calculate the second parity matrix PA2 using the first parity matrix PA1. The trans matrix Trans_Matrix [Ymat] may be expressed by the following equation 23.

$$Ymat = \begin{bmatrix} Y_{0,0} & \cdots & Y_{0,8} \\ Y_{1,0} & \cdots & Y_{1,8} \\ \vdots & \ddots & \vdots \\ Y_{7,0} & \cdots & Y_{7,8} \end{bmatrix} \quad \text{(Equation 23)}$$

The second matrix multiplier 522 or the second parity generation part 220 may perform a multiplying operation of the trans matrix [Ymat] outputted from the trans matrix logic circuit 521 and the high-order first parity matrix PA1_2 to output a mid-matrix [MM] having a '8×1' matrix form. A calculating process of the mid-matrix [MM] may be expressed by the following equation 24.

$$MM = \begin{bmatrix} Y_{0,0} & \cdots & Y_{0,8} \\ Y_{1,0} & \cdots & Y_{1,8} \\ \vdots & \ddots & \vdots \\ Y_{7,0} & \cdots & Y_{7,8} \end{bmatrix} \times \begin{bmatrix} P1_8 \\ P1_9 \\ \vdots \\ P1_{16} \end{bmatrix} \quad \text{(Equation 24)}$$

The mid-matrix [MM] outputted from the second matrix multiplier 522 may be inputted to the matrix adder 523. The matrix adder 523 may perform an adding operation of the low-order first parity matrix PA1_1 outputted from the first parity generation part 510 and the mid-matrix [MM] outputted from the second matrix multiplier 522 and may output the second parity matrix PA2 as a result of the adding operation. A process of calculating the second parity matrix PA2 may be expressed by the following equation 25.

$$PA2 = \begin{bmatrix} P1_0 \\ P1_1 \\ \vdots \\ P1_7 \end{bmatrix} + MM \quad \text{(Equation 25)}$$

The multiplexer 530 may select and output the data inputted to the first input terminal of the multiplexer 530 or the data inputted to the second input terminal of the multiplexer 530 in response to an error correction mode control signal CS_ECL. The first input terminal of the multiplexer 530 may receive the first parity matrix PA1 outputted from the first parity generation part 510. The second input terminal of the multiplexer 530 may receive the second parity matrix PA2 outputted from the second parity generation part 520. In an embodiment, the error correction mode control signal CS_ECL having a logic "high(1)" level may be inputted to the multiplexer 530 in the first error correction mode. In such a case, the multiplexer 530 may output the first parity matrix PA1 inputted to the first input terminal of the multiplexer 530. In contrast, the error correction mode control signal CS_ECL having a logic "low(0)" level may be inputted to the multiplexer 530 in the second error correction mode. In such a case, the multiplexer 530 may output the second parity matrix PA2 inputted to the second input terminal of the multiplexer 530.

According to the embodiments described above, a second parity for error correction in the second error correction mode may be generated using a first parity for error correction in the first error correction mode. Thus, it may be possible to reduce a layout area of a parity generation logic circuit for a plurality of error correction levels.

The embodiments of the disclosed technology have been disclosed above for illustrative purposes. Those of ordinary skill in the art will appreciate that various modifications, additions, and substitutions are possible. While this patent document contains many specifics, these should not be construed as limitations on the scope of the present teachings or what may be claimed, but rather as descriptions of features that may be specific to particular embodiments of the present teachings. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A parity generation logic circuit comprising:
a first parity generation part configured to generate a first parity in a first error correction mode having a first error correction capability for original data; and
a second parity generation part configured to generate a second parity using the first parity in a second error correction mode having a second error correction capability,
wherein, when the original data are comprised of "NN"-number of data symbols (where, "NN" is a natural number), the first parity is comprised of "NP1"-number of first parity symbols (wherein, "NP1" is a natural number), and the second parity is comprised of "NP2"-number of second parity symbols (wherein, "NP2" is a natural number), the first parity generation part includes:
a first encoding matrix logic circuit configured to output a first encoding matrix having a 'NP1×NN' matrix form;
a data inverse matrix logic circuit configured to output a data inverse matrix having a 'NN×1' matrix form; and
a first matrix multiplier configured to perform a multiplying operation of the data inverse matrix and the first encoding matrix to output a first parity matrix having a 'NP1×1' matrix form.

2. The parity generation logic circuit of claim 1, further comprising a selection output part configured to selectively output one of the first parity and the second parity.

3. The parity generation logic circuit of claim 2,
wherein the selection output part includes a multiplexer comprising a first input terminal, a second input terminal, a control signal input terminal, and an output terminal;
wherein the first parity outputted from the first parity generation part is inputted to the first input terminal of the multiplexer;
wherein the second parity outputted from the second parity generation part is inputted to the second input terminal of the multiplexer; and
wherein the multiplexer is configured to selectively output one of the first parity and the second parity through the output terminal of the multiplexer in response to an error correction mode control signal inputted to the control signal input terminal of the multiplexer.

4. The parity generation logic circuit of claim 1,
wherein the first parity includes a plurality of first parity symbols;
wherein the second parity includes a plurality of second parity symbols; and
wherein the number of first parity symbols is greater than the number of second parity symbols.

5. The parity generation logic circuit of claim 1, wherein the second parity generation part includes:
a trans matrix logic circuit configured to output a trans matrix having a 'NP2×(NP1-NP2)' matrix form;
a second matrix multiplier configured to perform a multiplying operation of a low-order first parity matrix having a '(NP1-NP2)×1' matrix form obtained from the first parity matrix and the trans matrix having a 'NP2×(NP1-NP2)' matrix form to output a mid-matrix having a 'NP2×1' matrix form; and
a matrix adder configured to add a high-order first parity matrix having a 'NP2×1' matrix form obtained from the first parity matrix to the mid-matrix to output a second parity matrix having a 'NP2×1' matrix form.

6. A memory controller for controlling a write operation of a memory device, the memory controller comprising:
an error correction code (ECC) encoder including a parity generation logic circuit configured to generate a parity for original data,
wherein the parity generation logic circuit includes:
a first parity generation part configured to generate a first parity in a first error correction mode having a first error correction capability; and
a second parity generation part configured to generate a second parity using the first parity in a second error correction mode having a second error correction capability,
wherein, when the original data are comprised of "NN"-number of data symbols (where, "NN" is a natural number), the first parity is comprised of "NP1"-number of first parity symbols (wherein, "NP1" is a natural number), and the second parity is comprised of "NP2"-number of second parity symbols (wherein, "NP2" is a natural number), the first parity generation part includes:

a first encoding matrix logic circuit configured to output a first encoding matrix having a 'NP1×NN' matrix form;

a data inverse matrix logic circuit configured to output a data inverse matrix having a 'NN×1' matrix form; and a first matrix multiplier configured to perform a multiplying operation of the data inverse matrix and the first encoding matrix to output a first parity matrix having a 'NP1×1' matrix form.

7. The memory controller of claim 6, wherein the parity generation logic circuit further includes a selection output part configured to selectively output one of the first parity and the second parity.

8. The memory controller of claim 7, wherein the selection output part includes a multiplexer comprising a first input terminal, a second input terminal, a control signal input terminal, and an output terminal;

wherein the first parity outputted from the first parity generation part is inputted to the first input terminal of the multiplexer;

wherein the second parity outputted from the second parity generation part is inputted to the second input terminal of the multiplexer; and wherein the multiplexer is configured to selectively output one of the first parity and the second parity through the output terminal of the multiplexer in response to an error correction mode control signal inputted to the control signal input terminal of the multiplexer.

9. The memory controller of claim 6, wherein the first parity includes a plurality of first parity symbols;

wherein the second parity includes a plurality of second parity symbols; and wherein the number of first parity symbols is greater than the number of second parity symbols.

10. The memory controller of claim 6, wherein the second parity generation part includes:

a trans matrix logic circuit configured to output a trans matrix having a 'NP2×(NP1-NP2)' matrix form;

a second matrix multiplier configured to perform a multiplying operation of a low-order first parity matrix having a '(NP1-NP2)×1' matrix form obtained from the first parity matrix and the trans matrix having a 'NP2×(NP1-NP2)' matrix form to output a mid-matrix having a 'NP2×1' matrix form; and a matrix adder configured to add a high-order first parity matrix having a 'NP2×1' matrix form obtained from the first parity matrix to the mid-matrix to output a second parity matrix having a 'NP2×1' matrix form.

11. A memory module including a plurality of memory media and a memory module controller for controlling access to the plurality of memory media, the memory module controller comprising:

an error correction code (ECC) encoder having a parity generation logic circuit configured to generate a parity for original data, wherein the parity generation logic circuit includes:

a first parity generation part configured to generate a first parity in a first error correction mode having a first error correction capability; and a second parity generation part configured to generate a second parity using the first parity in a second error correction mode having a second error correction capability, wherein, when the original data are comprised of "NN"-number of data symbols (where, "NN" is a natural number), the first parity is comprised of "NP1"-number of first parity symbols (wherein, "NP1" is a natural number), and the second parity is comprised of "NP2"-number of second parity symbols (wherein, "NP2" is a natural number), the first parity generation part includes:

a first encoding matrix logic circuit configured to output a first encoding matrix having a 'NP1×NN' matrix form;

a data inverse matrix logic circuit configured to output a data inverse matrix having a 'NN×1' matrix form; and a first matrix multiplier configured to perform a multiplying operation of the data inverse matrix and the first encoding matrix to output a first parity matrix having a 'NP1×1' matrix form.

12. The memory module of claim 11, wherein the plurality of memory media includes:

a plurality of data chips configured to store data;

a plurality of first ECC chips configured to store the first parity; and a plurality of second ECC chips configured to store the first parity and the second parity.

13. The memory module of claim 11, wherein the parity generation logic circuit further includes a selection output part configured to selectively output one of the first parity and the second parity.

14. The memory module of claim 11, wherein the first parity includes a plurality of first parity symbols;

wherein the second parity includes a plurality of second parity symbols; and wherein a number of first parity symbols is greater than a number of second parity symbols.

* * * * *